(12) United States Patent
Tuominen et al.

(10) Patent No.: US 9,801,270 B2
(45) Date of Patent: Oct. 24, 2017

(54) PRINTED CIRCUIT BOARD HAVING A GROUND PLANE WITH ANGLED OPENINGS ORIENTED BETWEEN 30 TO 60 DEGREES

(71) Applicant: AT&S Austria Technologie & Systemtechnik Aktiengesellschaft, Leoben (AT)

(72) Inventors: Mikael Tuominen, Shanghai (CN); Martin Fischeneder, Behamberg (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 14/651,578

(22) PCT Filed: Dec. 9, 2013

(86) PCT No.: PCT/AT2013/050238
§ 371 (c)(1),
(2) Date: Jun. 11, 2015

(87) PCT Pub. No.: WO2014/089587
PCT Pub. Date: Jun. 19, 2014

(65) Prior Publication Data
US 2015/0327359 A1    Nov. 12, 2015

(30) Foreign Application Priority Data

Dec. 11, 2012    (CN) .................... 2012 2 0680735 U

(51) Int. Cl.
*H05K 1/02*    (2006.01)
*H01P 3/08*    (2006.01)

(52) U.S. Cl.
CPC ............. *H05K 1/0253* (2013.01); *H01P 3/08* (2013.01); *H05K 1/0225* (2013.01);
(Continued)

(58) Field of Classification Search
CPC ...... H01P 3/082; H05K 1/0253; H05K 1/025; H05K 1/0225
(Continued)

(56) References Cited

U.S. PATENT DOCUMENTS 6,624,729 B2 *   9/2003   Wright et al. .......... H01P 3/081
                                                          333/238
8,324,979 B2 *  12/2012   Cho ..................... H01L 23/5225
                                                          333/238
(Continued)

FOREIGN PATENT DOCUMENTS

JP    2007123740 A    5/2007
JP    2009105207 A    5/2009

OTHER PUBLICATIONS

International Search Report and Written Opinion for International Application No. PCT/AT2013/050238, Search completed Feb. 19, 2014, dated Feb. 26, 2014, 8 Pgs.

*Primary Examiner* — Benny Lee
(74) *Attorney, Agent, or Firm* — KPPB LLP

(57) ABSTRACT

A printed circuit board that includes conductive layers separated by insulation layers of dielectric material, at least one conductive layer being patterned and having at least one signal line embedded in an insulation material, whereby a conductive ground plan layer, separated by the insulation material and lying in a predetermined distance (d) from the at least one signal line includes a ground plane area associated to and extending along the at least one signal line, the conductive layer associated to and extending along the at least one signal line is provided with openings therein. Preferably the openings are spaces between conducting stripes, extending, seen from above, across the at least one signal line, the conducting stripes being integrally connected with the conductive remainder of the conductive layer.

5 Claims, 1 Drawing Sheet

(52) U.S. Cl.
CPC ... *H05K 1/0245* (2013.01); *H05K 2201/0969* (2013.01); *H05K 2201/09272* (2013.01)

(58) Field of Classification Search
USPC .................................................. 333/238, 33
See application file for complete search history.

(56) References Cited

U.S. PATENT DOCUMENTS

| | | | |
|---|---|---|---|
| 2009/0179712 A1* | 7/2009 | Jang et al. | H01P 3/026 333/33 |
| 2009/0302976 A1* | 12/2009 | Cho | H01P 3/082 333/238 |
| 2012/0097433 A1 | 4/2012 | Ishino et al. | |

* cited by examiner

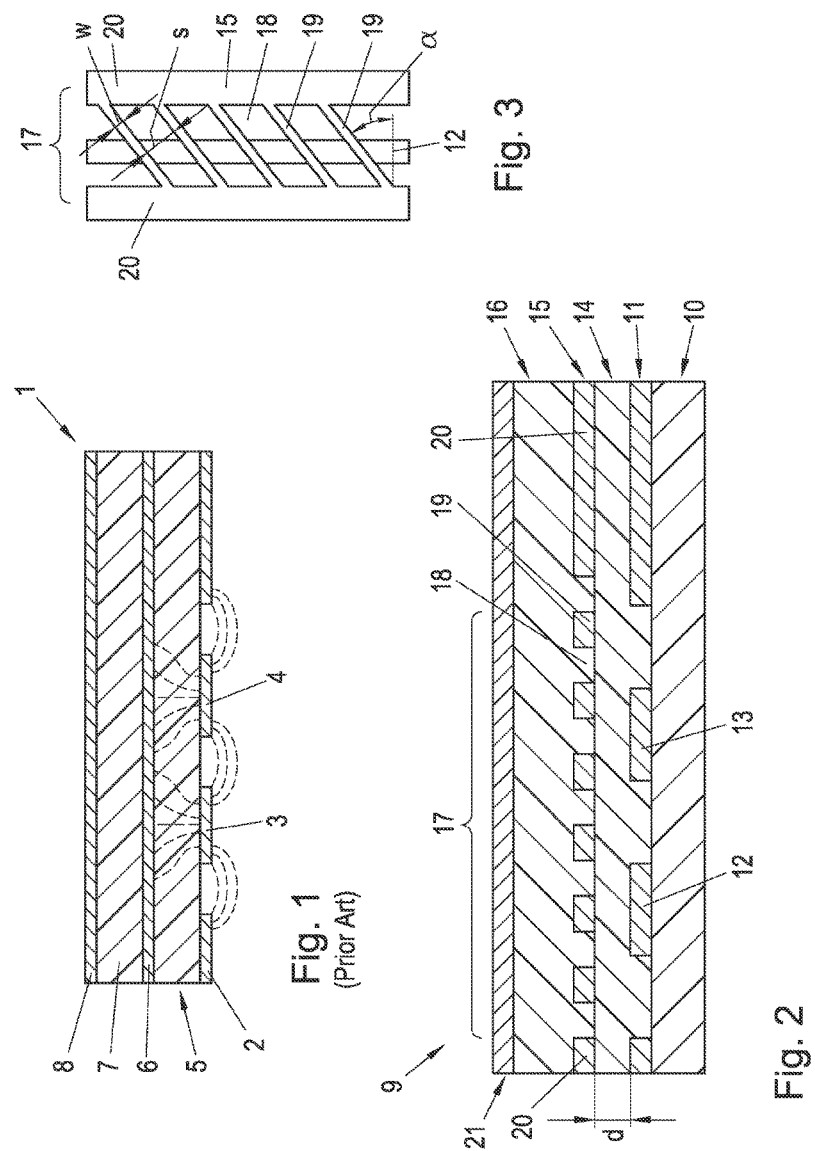

PRINTED CIRCUIT BOARD HAVING A GROUND PLANE WITH ANGLED OPENINGS ORIENTED BETWEEN 30 TO 60 DEGREES

CROSS REFERENCE TO RELATED APPLICATIONS

This application is a national phase 35 U.S.C. §371 filing of PCT Application No. PCT/AT2013/050238 filed on Dec. 9, 2013 which claims priority to Chinese Application No. 201220680735.X filed on Dec. 11, 2012, the disclosures of which are hereby incorporated by reference in their entireties.

BACKGROUND OF THE INVENTION

Field of the Invention

The present invention relates to a printed circuit board (PCB) and in particular to a printed circuit board comprising conductive layers separated by insulation layers of dielectric material, at least one conductive layer being patterned and having at least one signal line embedded in an insulation material, whereby a conductive layer, separated by the insulation material and lying in a predetermined distance from the at least one signal line includes a ground plane area associated to and extending along the at least one signal line.

Description of the Related Art

Increasing miniaturization and extreme electronic component density as well as the necessity to transfer large amounts of data at high speed, e.g. at rates of 1 to 5 Gbps, can create serious problems with respect to signal integrity in PCBs. A specific problem with signal integrity in a PCB is the desire to configure signal lines with predetermined high impedance. In order to avoid signal losses due to reflections at interfaces with other signal lines, it is necessary to adjust the line impedance during the manufacture of a PCB as accurately as possible. Leakage currents, which should be as small as possible, constitute a further problem. A still further problem, typically for high speed lines, is associated with return currents in HF-applications. Diverging return current paths lead to an uncontrolled impedance of the transmission line between a signal line and a ground plane. Accordingly, it is generally recommended to avoid any splitting of the ground plane. Finally, the current paths may be considered an antenna that receives and transmits signal energy creating electromagnetic interference.

FIG. 1 is a cross sectional view of a PCB having three conducting layers, separated by two dielectric insulation layers. In this example of a conventional PCB 1 the bottom layer 2 is a structured layer of conductive material, mostly copper, having two signal lines 3, 4. Separated by a dielectric layer 5 there is arranged a further conductive layer 6, acting as a ground plane. This layer may be a structured layer of conductive material too, however in "electrically" proximity of the signal lines this layer 6 is made continuous. The conductive layer is followed by another dielectric insulation layer 7 and here the uppermost layer is a further conductive layer 8, which may be a structured layer of conductive material in a well-known manner. Electrical field lines are indicated schematically by broken lines.

The impedance of the signal transmission line is a function, amongst others, of the distance between the signal lines 3, 4; ground defined primarily by the conductive layer 6; the width of the lines 3, 4; and the relative permittivity $\in_r$ of dielectric layer 5. At a given width of a signal line, a higher impedance may be reached by using a dielectric layer with a low relative permittivity $\in_r$ and/or by increasing the distance between the signal line and the conductive layer 6. Since the relative permittivity is determined in most cases by the commercially available materials, such as, but not limited to prepregs, FR4, Polyimide etc., the impedance may be increased by increasing the distance between the signal lines 3, 4 and the conductive layer 6. The increase in distance leads to an undesirable increase of the thickness of the PCB as such. The current standard impedance requirement of 90-100 ohms is almost impossible to achieve for a strip line with a single dielectric layer multilayer microvia stack of a HDI (High Density Interconnect) PCB. This is a challenge for the designers, who in some cases need to introduce an additional layer just to reach the required impedance in some specific tight areas of the stack. In addition, in order to reduce loss of electrical signal in high-frequency applications, the PCB must show low dielectric constant and low dielectric loss.

SUMMARY OF THE INVENTION

An object of the present invention is to provide a PCB with signal lines, having predefined impedance, which can be adjusted already during the manufacture of the PCB.

A further object of the present invention is to provide a PCB with signal lines with improved signal integrity, e.g. well defined return current paths.

Quite another object of the present invention is to provide a PCB with reduced problems caused by the creation of electromagnetic interference.

Another object of the invention is the provision of a PCB with signal lines having, despite of small thickness, reduced loss in high-frequency regions.

Thus, the present invention provides a printed circuit board comprising conductive layers separated by insulation layers of dielectric material, at least one conductive layer being patterned and having at least one signal line embedded in an insulation material, whereby a conductive ground plane layer, separated from the at least one conductive layer by the insulation material at a predetermined distance from the at least one signal line, includes a ground plane area associated with and extending along the at least one signal line where the conductive layer associated with and extending along the at least one signal line is provided with openings therein.

Preferably the openings are spaces between conducting stripes extending, as seen from above, across the at least one signal line where the conducting stripes are integrally connected with the conductive remainder of the conductive layer.

The conducting stripes may cross the signal line at an angle of 30°-60°, preferably at an angle of 45°.

The width of the conducting stripes can be smaller than the distance between adjacent conducting stripes.

The ratio of the width of the conducting stripes and the distance between adjacent stripes is preferably between 0.1 and 0.8.

A preferred embodiment of the invention comprises at least a support core, a first structured conductive layer including the at least one signal line arranged on the support core, followed by a first prepreg-layer, a second structured conductive layer including the ground plane area layer with openings therein, followed by a second prepreg-layer and a third conductive layer arranged on said second prepreg layer.

A printed circuit board according to the invention may further comprise two differential signal lines, arranged in parallel, the ground plane area being associated with both signal lines.

BRIEF DESCRIPTION OF THE DRAWINGS

FIG. 1 is a schematic cross-sectional view of a PCB having two signal lines according to prior art.

FIG. 2 is a schematic cross-sectional view of a PCB according to the invention having two signal lines and a hatched ground plane.

FIG. 3 is a simplified and schematic plane view showing the arrangement of a ground plane area with respect to a single signal line.

DETAILED DESCRIPTION OF THE INVENTION

Embodiments of a PCB according to the invention will be described below in more detail with reference to the accompanying drawings. For same or similar components same reference numerals are used in order to avoid redundant explanations.

A printed circuit board 9 according to the invention, as shown in FIG. 2 comprises a bottom layer, namely a support core layer 10, made of a dielectric material such as, but not limited to, FR 4 material or polyimide. Conductive layer 11 is built on the support core layer 10, the conductive layer 11 being patterned and having two signal lines 12, 13, extending in a direction perpendicular to the plane of FIG. 2. The signal lines 12, 13, for example, may serve as differential signal lines, preferably with a nominal impedance of 50-100 ohm. The support core layer 10 with the structured conductive layer 11 is followed by a first prepreg-layer 14, which covers the conductive layer 11. In this way, the signal lines 12, 13 are completely embedded in dielectric material, i.e. on their lower surface by the support core layer 10 and on their upper surface and their sides by the first prepreg-layer 14.

Next follows a second structured conductive layer 15 covered by a second prepreg-layer 16. Conductive layer 15 comprises an area acting as a ground plane area 17 associated with and extending along the signal lines 12, 13. This ground plane area 17 of conductive layer 15 is provided with openings 18. In the example shown, these openings are spaces between conducting stripes 19, extending, seen from above, across signal lines 12, 13 where the conducting stripes being integrally connected with the conductive remainder 20 of conductive layer 15.

This can be seen better in FIG. 3, which is a plane view showing the arrangement of the ground plane area 17 of conductive layer 15 including conductive remainder 20. Openings 18 and the stripes 19 are arranged above one single signal line 12.

Returning to FIG. 2, the stripes 19 are completely embedded in dielectric material, i.e. on their lower surface by the first prepreg-layer 14 and on their upper surface and their sides by the second prepreg-layer 16 that also fills the openings 18.

Top layer of the circuit board 9 is a third conductive layer 21 which may be patterned, having conductor paths, not shown in the drawings. FIG. 2 only illustrates a part of a PCB with the features in accordance with some embodiments of the invention. In general, PCB 9 will have larger size and will not be limited to a certain number of layers. Furthermore, PCB 9 will have vias or microvias interconnecting conductor paths of different layers. As shown, two electrical field lines are indicated schematically by broken lines and it should be mentioned that parts of the conductive layer 11, adjacent to signal lines 12, 13, act partly as a ground plane.

It has been found that a very stable performance of the strip line can be achieved if the conducting stripes cross the signal line at an angle, α, of 30°-60°. Preferably the conducting stripes across the signal line at an angle, α, of 45°, as depicted in FIG. 3. In this way, it is possible to raise the impedance of the signal lines without creating severe problems with regard to return currents and attenuation.

It is recommendable that the width, w, of the conducting stripes 19 is smaller than the distance, s, between adjacent stripes. A preferred ratio of the width, w, of the conducting stripes 19 and the distance, s, between adjacent stripes is between 0.1 and 0.8. This can be seen in FIG. 3 However, it should be noted that FIGS. 2 and 3 are only schematic representations of the invention and not drawn to scale.

Support core 10 is made by impregnating reinforcing material like glass fibres with resin—e.g. epoxy resin, available under grade designations such as FR-4, FR-5 or others or by using polyimide resin. First and second prepreg-layers 14, 16 advantageously consist of FR-4, but other dielectric materials, suitable for a lamination process may be used.

A typical thickness of conductive layers, usually consisting of copper ranges between 1 and 20 μm, a typical thickness (d in FIG. 2) of the dielectric layers between 5 and 40 μm.

PCB 9 may also be a flex type PCB or a rigid-flex type PCB. In these cases, other materials for the dielectric layers and thinner conducting layers may be used at least for flexible parts of the PCB.

The invention is not restricted to differential signal lines and may include only one line or more than two signal lines.

While the foregoing description is directed to various preferred embodiments of the invention, it should be noted that variations and modifications will be apparent to the skilled person without departing from the scope of the invention as defined by the following claims.

The invention claimed is:

1. A printed circuit board comprising conductive layers separated by insulation layers of a dielectric material, a first one of the conductive layers being patterned and having at least one signal line embedded in the insulation layers of the dielectric material, whereby a second one of the conductive layers separated by at least one of the insulation layers from the first one of the conductive layers and lying in a predetermined distance from the at least one signal line in the first one of the conductive layers includes a ground plane area associated with and extending along the at least one signal line, whereby the second one of the conductive layers having the ground plane area associated with and extending along the at least one signal line is provided with openings therein, said openings being spaces between adjacent conducting stripes that extend across the at least one signal line, the adjacent conducting stripes being integrally connected with the remainder of the conductive material in the second one of conductive layers, characterized in that the adjacent conducting stripes cross the signal line at an angle α of 30° - 60° whereby the adjacent conducting stripes provide defined return current paths; and wherein the insulation layers include a support core, a first prepreg layer and a second prepreg layer where the first one of the conductive layers is a first structured conductive layer that includes the at least one signal line and is arranged on the support core, the first prepreg-layer arranged on the first one of the conductive layers where the second one of the conductive layers is a second structured conductive layer that includes the ground plane area with the openings therein and is arranged on the first prepreg-layer, and the second prepreg-layer arranged on the second one of the conductive layers where a third one of the conductive layers is a third conductive layer arranged on said second prepreg-layer.

2. A printed circuit board according to claim 1, characterized in that the adjacent conducting stripes cross the signal line at the angle α of 45°.

3. A printed circuit board according to claim 1, characterized in the each of the adjacent conducting stripes has a width that is smaller than the distance between adjacent stripes.

4. A printed circuit board according to claim 3, characterized in that the ratio of the width of the each of the adjacent conducting stripes and the distance between adjacent conducting stripes is between 0.1 and 0.8.

5. A printed circuit board according to claim 1, characterized in that the at least one signal line comprises two differential signal lines, arranged in parallel with the ground plane area being associated to the two differential signal lines.

* * * * *